United States Patent [19]

Weldon et al.

[11] 4,319,204
[45] Mar. 9, 1982

[54] PHASE MODULATED SQUARE WAVE GENERATOR

[75] Inventors: James O. Weldon; Joseph B. Sainton, both of Dallas, Tex.

[73] Assignee: Continental Electronics Mfg. Co., Dallas, Tex.

[21] Appl. No.: 159,897

[22] Filed: Jun. 16, 1980

Related U.S. Application Data

[62] Division of Ser. No. 960,677, Nov. 14, 1978, abandoned.

[51] Int. Cl.³ .............................................. H03K 7/04
[52] U.S. Cl. .................................... 332/9 R; 328/155; 332/23 R; 332/43 B; 332/48
[58] Field of Search ...................... 332/9 R, 9 T, 16 R, 332/16 T, 22, 23 R, 31 R, 31 T, 41, 43 R, 43 B, 48; 375/23, 44; 328/155

[56] References Cited

U.S. PATENT DOCUMENTS

| | | | |
|---|---|---|---|
| 3,075,136 | 1/1963 | Jones | 363/139 |
| 3,170,127 | 2/1965 | Cramer | 332/41 |
| 3,245,006 | 4/1966 | Runyan | 332/43 B |
| 3,978,424 | 8/1976 | Hobo et al. | 331/45 |

FOREIGN PATENT DOCUMENTS 1024441 3/1966 United Kingdom .
1111646 5/1968 United Kingdom .

OTHER PUBLICATIONS

Avakyan et al., "Pulse Position Modulator with Rectangular Symmetric Pulses," Instruments and Experimental Techniques, vol. 20, May/Jun. 1977, pp. 740, 741.
Bedford et al., "Principles of Inverter Circuits", J. Wiley and Sons, 1964, pp. 234-237.
Brunstein, "Frequency Doubler and Flip-Flop Make Adjustable Phase Shifter", Electronics, Oct. 14, 1976, p. 100.
Clark, "A Comparison of Current Broadcast Amplitude-Modulation Techniques", IEEE Trans. on Broadcasting, vol. BC-21, No. 2, Jun. 1975, pp. 25-31.

Primary Examiner—Siegfried H. Grimm
Attorney, Agent, or Firm—Nolte and Nolte

[57] ABSTRACT

A pair of square waves of a carrier frequency are applied respectively to a pair of amplifier circuits having a common output circuit. The output circuit is connected so that the energy therein is dependent upon the relative phases of the square waves. A further circuit is provided for varying the relative phases of the two square waves, so that the output from the output circuit is in the form of amplitude modulated oscillations.

15 Claims, 39 Drawing Figures

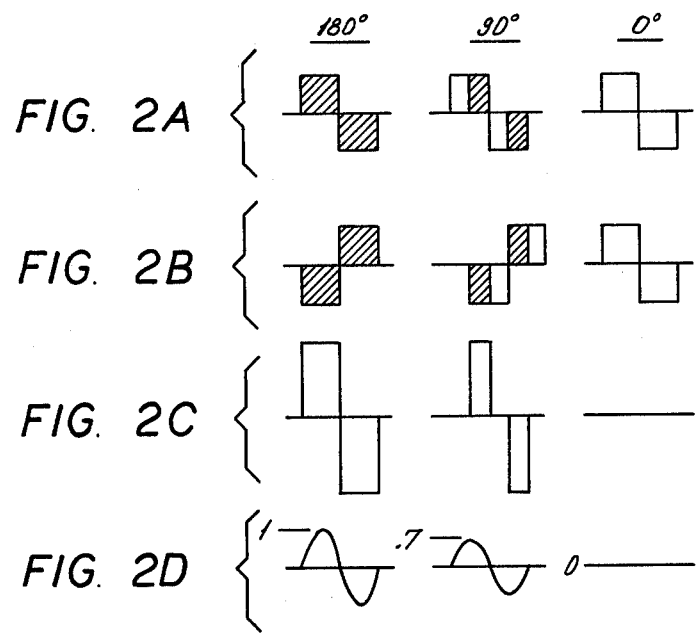
FIG. 2A
FIG. 2B
FIG. 2C
FIG. 2D
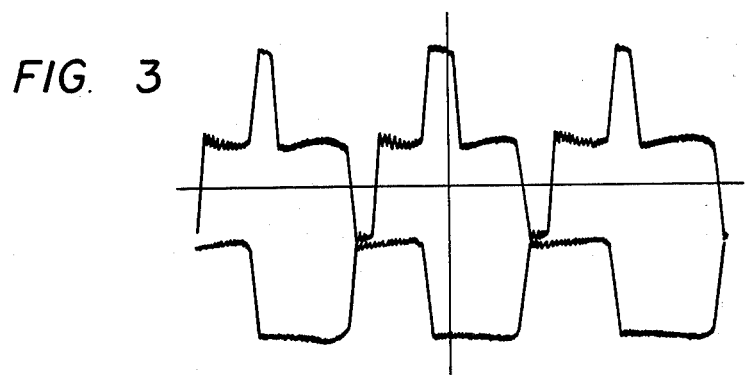
FIG. 3
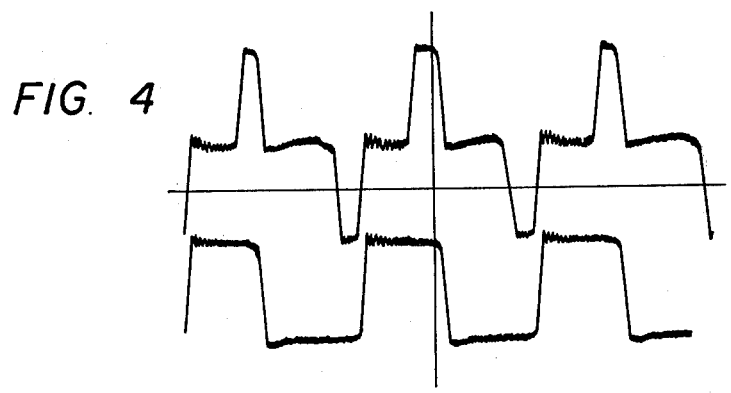
FIG. 4

1,000 KHz 1,000 KHz

500 KHz

500 KHz

RAMP 2A EVERY ½ CYCLE

TRIGGER ON X

TRIGGER ON Y

TRIGGER ON Z

RAMP 2B EVERY ½ CYCLE

TRIGGER ON P

TRIGGER ON D

TRIGGER ON Q

SET-RESET X-P 0°

SET-RESET Y-D 90°

SET-RESET Z-Q 180°

REFERENCE OUTPUT

PHASE MODULATED SQUARE WAVE GENERATOR

This application is a division, of application Ser. No. 960,677, filed Nov. 14, 1978 and now abandoned.

BACKGROUND OF THE INVENTION

This invention relates to the generation of controlled energy oscillations, and is particularly directed to a method and apparatus for the production of controlled energy oscillations, such as amplitude modulated oscillations, wherein conventional modulators are not employed.

In conventional modulation circuits of one type, carrier oscillations are generated and amplified for application to a final or power amplifier, and separate modulating circuits are provided and connected to the power amplifier circuits for amplitude modulating of the oscillations. Such circuits have relatively low efficiency, and also require a comparatively large number of elements of high current capacity.

In order to overcome the disadvantages of such modulation systems, much more efficient techniques are disclosed, i.e. in U.S. Pat. Nos. 2,445,568, (Ferguson) and 4,118,677 (Weldon). In the arrangement of these references, variable width pulses of carrier frequency were generated for application to the final amplifier, the final amplifier being essentially in the form of a switching device. As a consequence, the high power modulation devices of conventional amplifying systems were avoided.

These arrangements, however, required the production of variable width rectangular pulses, although they were not essentially the same as the pulse width modulation techniques disclosed, i.e. in U.S. Pat. Nos. 3,440,566; 3,506,920 and 3,588,744.

In the publication, "High Power Outphasing Modulation", November 1935 Proceedings of the I.R.E., H. Chireix describes a system wherein a pair of separate radio frequency channels having sine wave amplification derived an output at the power amplifier stage by varying the phase of the sine waves, in order to produce modulation as a result of variation of the phases of the sine waves from 180° (for 0 output), up to 90° or more, the output being combined to deliver a signal to an antenna. The system of Chireix does not, however, provide for the production of controlled energy output oscillations simply by the variation of the relative phases of waves, in accordance with the present invention.

SUMMARY OF THE INVENTION

The present invention is directed to the provision for overcoming the disadvantages of prior art arrangements for the production or generation of amplitude modulated oscillations.

Briefly stated, in accordance with the invention, a pair of amplifier circuits are provided with a common output circuit. A pair of square waves of carrier frequency are generated, these square waves being applied to the two amplifier circuits. The output circuit is connected to the amplifiers so that the energy therefrom is controlled as a function of the phases of the square waves, and the phases of the square waves are, therefore, controlled as a function of desired amplitude modulation of the output oscillations.

In accordance with a further feature of the inventions, the phases of the square waves are controlled in accordance with a square law, relative to the signals to be impressed upon the output carrier wave oscillations, in order to simulate without distorting the effects obtained by conventional amplitude modulation techniques.

Still further, in accordance with the invention, each of the amplifier means comprises a pair of serially connected amplifier or switching devices, the corresponding switching device being alternately controlled to conduct by their respective square wave inputs. In this arrangement, the output circuit may be connected between the junctions of the switching devices of the two amplifier circuits.

In accordance with a further feature of the invention, the output circuit is comprised of a transformer coupled between the output terminals of the two amplifier devices, and a filter network connected to the output of the transformer for converting the resultant rectangular wave output to amplitude modulated sinusoidal oscillations.

As a result of the use of the method and system in accordance with the invention, the direction of the controlled energy output oscillations is greatly amplified and a more efficient system has been provided.

BRIEF FIGURE DESCRIPTION

In order that the invention will be more clearly understood, it will now be disclosed in greater detail with reference to the accompanying drawings, wherein:

FIGS. 2A to 2D are simplified time diagrams illustrating the principle of operation of the system of FIG. 1;

FIGS. 3 to 10 are oscillographs showing waves produced in a circuit in accordance with the invention.

DETAILED DISCLOSURE OF THE INVENTION

Figure 1:
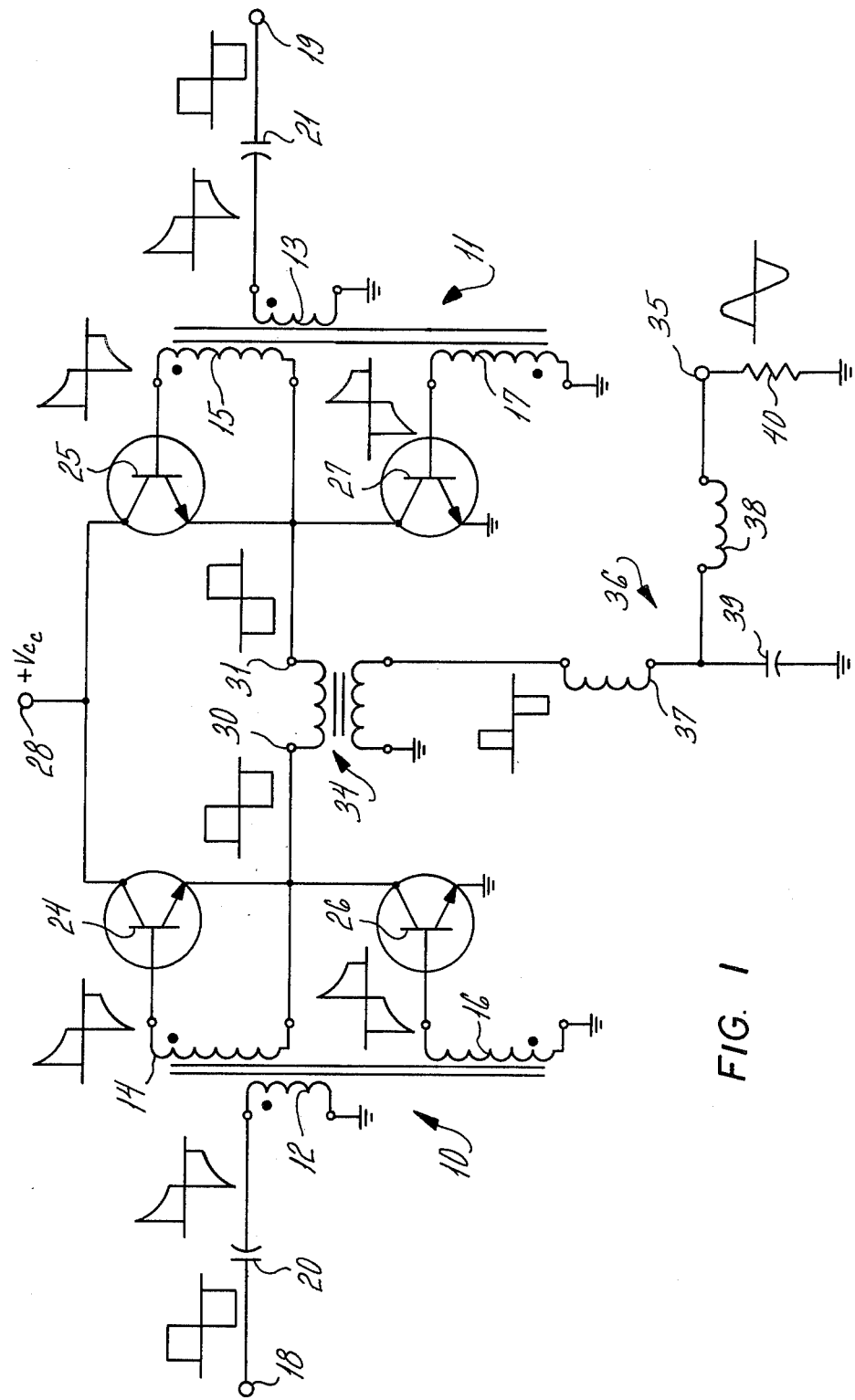
FIG. 1 is a simplified circuit diagram of one embodiment of a controlled energy oscillation generator in accordance with the invention.

Referring now to the drawings, therein is illustrated a circuit having the basic elements required for a system for generating amplitude oscillations, in accordance with one embodiment of the invention. This circuit is illustrated as including two input transformers 10 and 11 having primary windings 12 and 13, respectively. The first transformer 10 has a pair of secondary windings 14 and 16, and the second transformer 11 has a pair of secondary windings 15 and 17. The input winding 12 is connected to an input terminal 18 by way of a series capacitor 20, and similarly an input terminal 19 is connected to the primary winding 13 by way of a capacitor 21. One end of each of the secondary windings 14 and 16 is connected to the base of transistors 24 and 26, respectively. The emitter-collector paths of these transistors are serially connected in that order between ground reference and a positive operating source terminal 28. The other end of the secondary winding 14 is connected to the junction of the collector of transistor 26 and the emitter of transistor 24, as well as to the output terminal 30. The other end of the secondary winding 16 is connected to ground reference. Similarly the windings 15 and 17 each have one end connected to the base of transistors 25 and 27 respectively with the emitter-collector paths of these transistors being connected in series between the ground reference potential and the supply terminal 28. The other end of the winding 15 is connected to the junction of the emitter-collector paths of the transistors 25 and 27 as well as to the second output terminal 31. The other end of the winding 17 is connected to ground reference.

The windings of the transformers 10 and 11 are poled so that the potential applied to the bases of the respective transistors are opposite, whereby, the voltages at the respective output terminals 30 and 31 will alternate from substantially ground reference potential to substantially the potential of the operating voltage source.

It is thus evident that, excluding the supply terminal 28, the portions of the circuit so far represented by even reference numerals form one amplifying system, and the portions of the arrangement identified by odd reference numerals correspond to a second discrete amplifying system. The output terminals of these two amplifying systems are connected to an output circuit, to produce resultant output oscillations corresponding to the difference of the potentials at the respective output terminals. For this purpose, an output transformer 34 has its primary winding connected between the terminals 30 and 31, and its secondary winding connected between a system output terminal 35 and ground reference by way of a filter network 36. In the illustrated embodiment of the invention, the filter 36 is a T-network including series inductors 37 and 38 and a shunt capacitor 39. This filter is consequently a low-pass filter. It is evident, of course, that other forms of filters may be employed serving the function of smoothing the generally square wave output of the transformer 34 to a generally sinusoidal output across a load 40, as illustrated.

In operation of the circuit of FIG. 1, in accordance with the invention, square waves of the same frequency are applied to the input terminals 18 and 19, these square waves being of the carrier frequency of the oscillations eventually applied to the load 40. While the load 40 has been indicated as a resistor, it is, of course, evident that this representation has been shown for illustrative purposes only and the terminal 35 may thereby be coupled by conventional means, for example, to an antenna system for radiation of waves at the above carrier frequency.

It must also be stressed as employed above and in the remainder of this disclosure that the term "square wave" refers to waves having 50% duty cycle, since the optimum performance of the system depends on maintaining this relationship as closely as possible.

The general forms of the square waves, as they appear at different portions of the circuit, are sketched on the circuit of FIG. 1. Thus, the coupling capacitors 20 and 21 provide a slight differentiating effect, in combination with the input windings, and the transistors of each amplifier system are alternately saturated and non-conductive. As a consequence, square waves are also provided at the output terminals 30 and 31.

It is further evident that the wave form of the voltage at the output of the output transformer 34 will be dependent upon the phase relationship of the square wave voltages at the terminals 30 and 31. This relationship is more clearly evident by reference to FIG. 2. Thus, FIGS. 2A and 2B each show three separate square waves, aligned to be 180° out-of-phase, 90° out-of-phase and of the same phase respectively. FIG. 2C shows the waves which result from the difference of the waves of the two amplifier systems at these respective phase angles. It is thus evident that, when the two waves are 180° apart, the output voltage wave form has a 50% duty cycle and when the phase angle is 90° the widths of the output pulses have decreased. Finally, when the two voltages are in phase, no voltage output appears. FIG. 2D illustrates the resultant current output from the system, after filtration in the T-network filter. The action of the T-network filter results in the energy into the load resistor 40 as being transformed into a sinusoidal voltage and current wave whose amplitude depends upon the width of the square wave energy pulse at the input to the filter network. For example, as indicated in FIG. 2D, the amplitude of the sinusoidal output, when the two square wave voltages are 90° out-of-phase with one another, is indicated as being 0.7, on the basis of 1.0 when the two square wave voltages are 180° out-of-phase. As a consequence, it is evident that the output sinusoidal oscillations are amplitude modulated, in accordance with the invention, as a function of the relative phase differences of the two input square waves. The system in accordance with the invention thereby directly generates the modulated envelope output oscillations, and does not include a "stage" that can be referred to as "modulator stage" employing an active device, as in conventional modulation systems. Thus, the system of the invention does not employ a modulator stage, and may more properly be referred to as a controlled energy modulation system. The voltage of the square waves of the amplifiers, i.e., the square wave voltages at terminals 30 and 31, are constant. The output current varies, however, with the impressed modulation, which may be audio modulation, so that the energy developed at the output of the system is directly proportional to the value of the current.

In an amplitude modulation system, the power output on modulation peaks of 100% is four times the power output of the carrier with no modulation. In the system in accordance with the invention, the square wave voltage amplitude at the output of the power amplifiers is constant, so that the current variation at the output of the entire system must be proportional to the output energy required. Therefore, the current variation must vary from the carrier value to four times the carrier value on 100% modulation peaks. This requires that the current variation must follow a square law relative to a linear modulation voltage input. In other words, in accordance with the invention, if the relative phase of the outputs of the two amplifier systems of FIG. 1 is varied by a linear modulation voltage according to a square law, the energy delivered to the output network will vary in accordance with the energy in an amplitude modulated wave. The output network filter thereby is employed to convert the variable energy square wave output into a sine wave modulated envelope of carrier oscillations for application to the load or to a radiating element.

In the system of FIG. 1, the circuits for varying the relative phases of the input voltages to the amplifiers have not been illustrated. It will be evident, however, that the control of the relative phase may be effected by maintaining the phase of one of the input voltages constant while varying the relative phase of the other to provide the entire degree of phase variation. Alternately, the relative phase variation may be obtained by a simultaneous variation of the two square wave voltages. In the latter system, it is evident that each of the input voltages need be varied only from 0° to 90°, so that the full 180° variation of either of the voltages is not necessary as it is in the arrangement wherein one of the input voltages is held at a constant phase. The latter system prevents incidental phase modulation of the output carrier frequency envelope, and, in fact, will permit an adjustment of balance between the phase shift applied to the two amplifier systems for nulling out any incidental phase modulation.

For proper operation of the system, the load impedance at the output of the output transformer 34 should be resistive at the fundamental carrier frequency, which will generally be a radio frequency. Further, the output impedance should have an inductive reactance at all harmonics of the carrier frequency, in order to be able to maintain the square wave voltage at the output terminals of the amplifier systems, as well as at the output of the output transformer itself. It has been found that if the inductive reactance "seen" by the output transformer secondary winding at the third harmonit is approximately 5 to 10 times the value of the resistive component at the fundamental wave, satisfactory square wave voltages and rise times will be obtained at the output terminal 30 and 31 of the two amplifier systems.

In one example of the invention, the circuit of FIG. 1 was constructed employing four type SVT-300-3 transistors. The transmitter was constructed to have about 50 watts output, and variable phase square waves of 1000 KHz were applied to the input terminals 18 and 19. It must be pointed out, of course, that this selection of a carrier frequency is not intended to limit the scope of the invention.

FIG. 3 is a photograph in which the lower trace shows the square waves at the amplifier output terminal 31, and the upper trace shows the square wave at the secondary winding of the output transformer 34. FIG. 4 is a photograph in which the lower trace shows the voltage at the output terminal 30, the output voltage of the output transformer being illustrated in the upper trace. The upper trace of these two figures is thus the same, and represents a current pulse width corresponding to approximately carrier level for the 50 watt transmitter.

Figure 5:
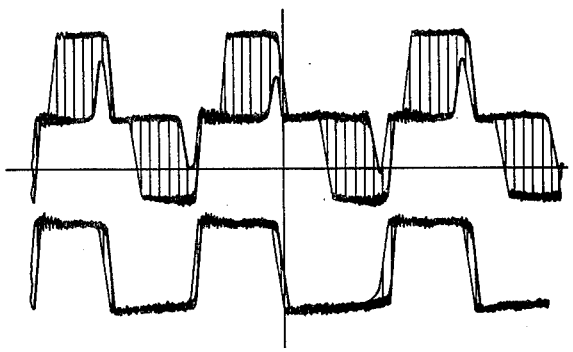
Figure 6:
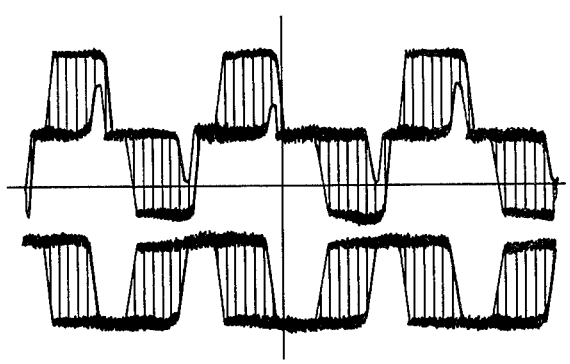
Figure 7:
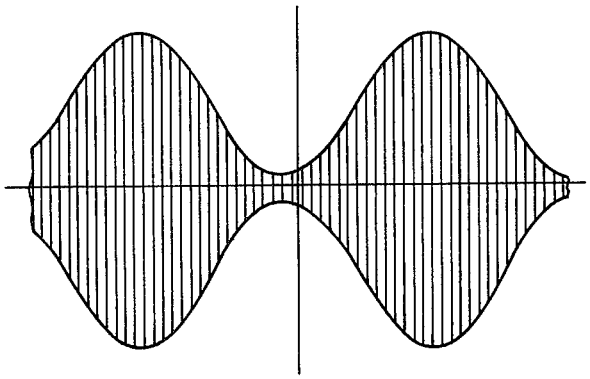
Figure 8:
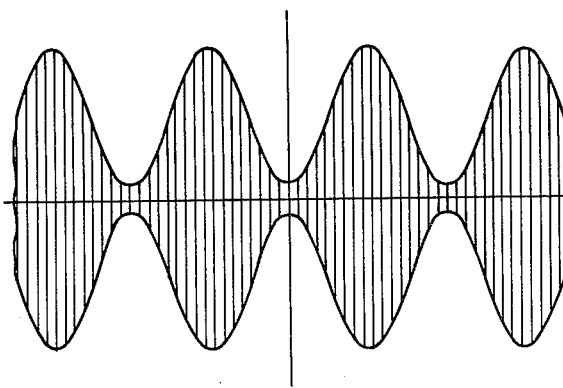

In FIG. 5, the photograph, in the lower trace, shows a square wave at the output terminal 31 of the right hand amplifier system of FIG. 1, this lower trace designating the "reference" phase. The upper trace of this figure shows the wave form at the output of the output transformer 34 with approximately 90% modulation at 100 Hz. The upper trace square wave in FIG. 5 illustrates some phase jitter as a result of cross-coupling in an integrated circuit employed in the exciter for the transmitter and is correctable. FIG. 6 is a photograph illustrating, in the lower trace, the variable phase following the modulation, which exists at the output terminal 30, which results in the upper trace wave form of FIGS. 5 and 6 at the output of the transformer 34 with 90% modulation at 100 Hz. FIG. 7 is a photograph illustrating the modulation envelope at the system output terminal 35, with a 5 Hz sinusoidal wave modulation at about 90%. In this wave, the total harmonic distortion is about 1.2%. FIG. 8 shows the system output wave form with 1000 Hz modulation at about 90% modulation. In this wave form, the total harmonic distortion is about 1%.

Figure 9:
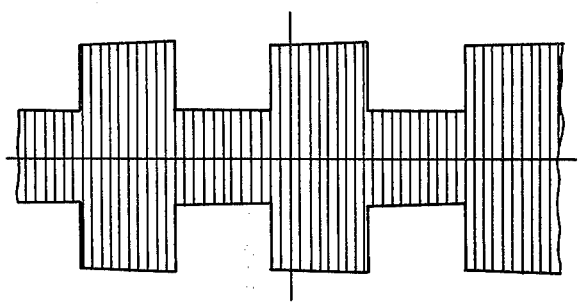
Figure 10:
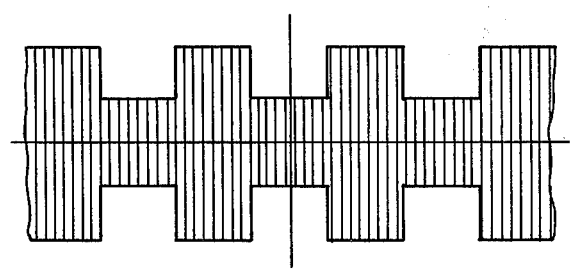

FIG. 9 is a photograph illustrating the system output with 50% square wave modulation at 20 Hz. In this figure, a small degree of tilt is discernable as a result of the position of too small a coupling capacitor employed for the audio signal in the exciter, and this effect is easily correctable. FIG. 10 illustrates the system output with square wave modulation at approximately 50 Hz and 50% modulation. The tilt is no longer visible under these conditions. With about 50% modulation with a 5000 Hz square wave signal a similar wave form was obtained although showing a very slight overshoot on the rise and fall times inherent in a broad band width system due to lack of critical damping.

Figure 11:
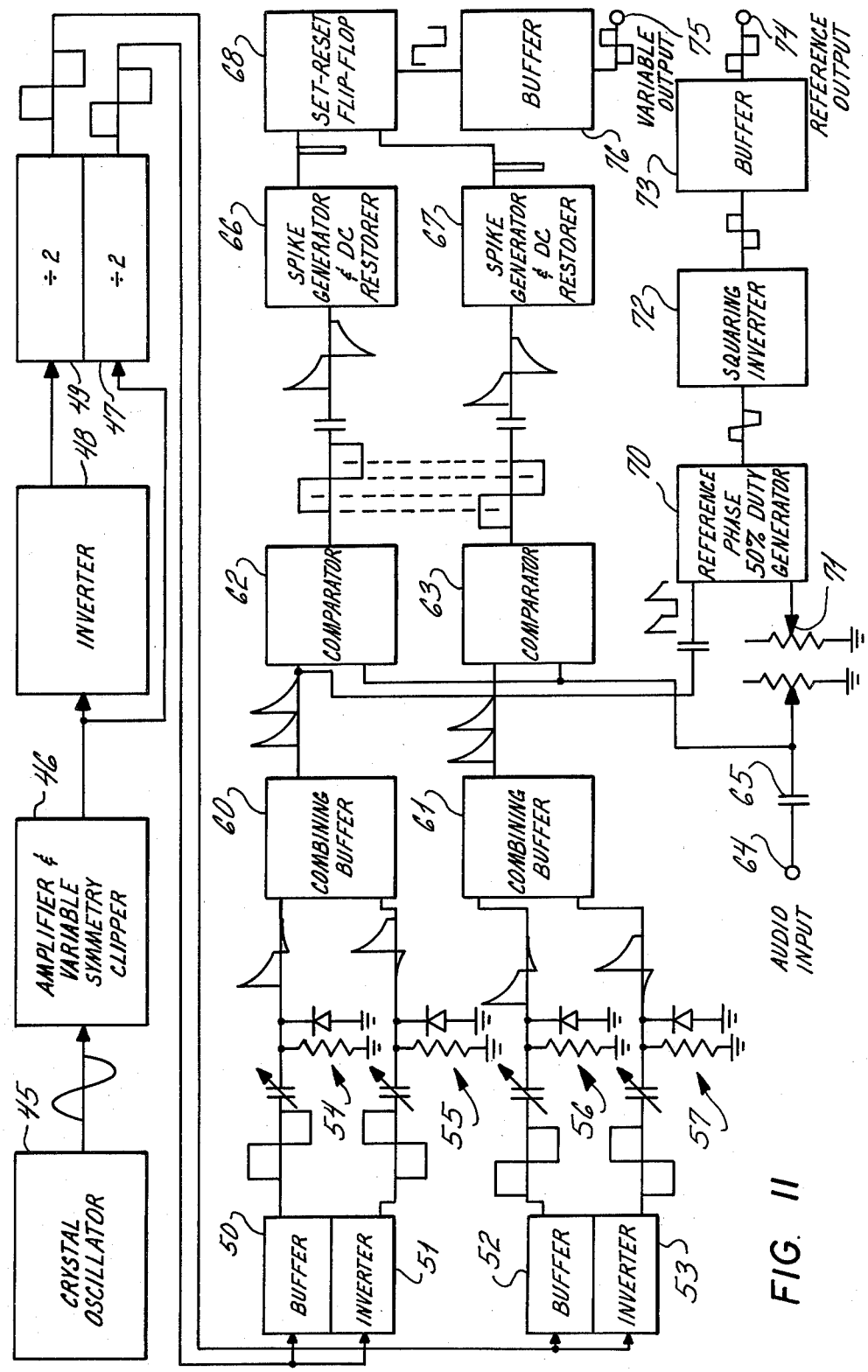
FIG. 11 is a block diagram of a system for producing square waves of variable phase in accordance with the invention.

FIG. 11 is a block diagram of an exciter that may be employed to produce the variable phase square wave voltages for application to the amplifier system of FIG. 1. While the arrangement of FIG. 11 shows a system in which one of the square wave voltage outputs is a reference output, this has been done for the sake of simplicity, and the system may vary the phase applied to both of the output amplifiers, in opposite directions. As further discussed above, in order for the output amplifier circuits of the system to function in a predictable manner, the drive requirements are that the two input square waves have a 50% duty cycle. There should be a possible phase variation of 180° between the two square wave voltage inputs to the amplifiers, and in the exciter of FIG. 11, this is effected by variation of only one of the square wave voltages. If both of the inputs to the amplifier are varied in phase, then, of course, each one must be varied by a maximum of only 90° in response to the audio or other input signal. As further discussed above, the phase variation must be in accordance with a square law, relative to linear modulation voltages impressed upon the system.

Figure 12A:
FIGS. 12A to 12R are timing diagrams illustrating the wave forms at specific points in the circuit of FIG. 11.
Figure 12B:
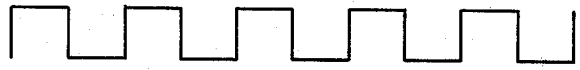
Figure 12C:

Referring now to FIG. 11, therein is illustrated a crystal oscillator 45 of conventional construction producing in the present example, a sinusoidal output of 1000 KHz. The output of the oscillator is amplified and symmetrically clipped in a conventional circuit 46 for this purpose, the square wave output of the clipper being illustrated in FIG. 12A. This square wave is applied directly to a divide by two circuit 47, to produce a 500 KHz square wave as illustrated in FIG. 12C. The output of the clipper 46 is also applied to an inverter 48, to produce the inverted 1000 KHz wave form as shown in FIG. 12B, with this voltage being applied to a divide by two circuit 49 to produce the phase shifted 500 KHz wave form illustrated in 12D.

It will be noted that the two 500 KHz signals have relative phase separation of 90° at this frequency.

The output of the divider 47 is connected to a buffer 50 and inverter 51 and the output of the divide by two circuit 49 is connected to a buffer 52 and an inverter 53. The output of each of these buffers and inverters is connected to a separate differentiating and dc restoring circuit 54, 55, 56, and 57, each of which may be comprised of a series capacitor, a shunt output resistor and a shunt output dc restoring diode. As a result, the outputs of these latter four circuits are ramp voltages of different phases.

Figure 12D:
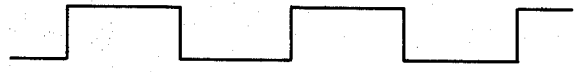
Figure 12E:
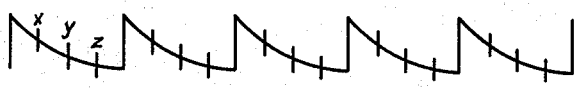

Still referring to FIG. 11, the ramp outputs of the dc restorers and differentiators 54 and 55, are combined additively in a combining buffer 60 to produce a ramp on every ½ cycle on the 500 KHz square wave signal, as illustrated in FIG. 12E. The ramp outputs of the dc restorers and differentiating circuits 56 and 57 are similarly combined in the combining buffer 61 to produce the ramp signal shown in FIG. 12J. The combining buffer circuits 60 and 61 may be comprised of conventional buffers and analog adding circuits.

Figure 12F:
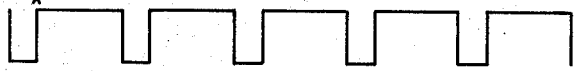
Figure 12G:
Figure 12H:

The outputs of the combining buffers 60 and 61 are applied to one input of the comparators 62 and 63 respectively, and an audio signal from an audio input terminal 64 is applied, by way of a coupling capacitor 65, to the other input of each of the comparators. The comparators 62 and 63 may comprise, for example, trigger circuits with variable thresholds in dependence upon the instantaneous amplitudes of the audio input modulation signals. As a consequence, the output of the comparator circuit 62 may comprise trigger signals having descending flanks at the start of the corresponding ramps, and ascending flanks when the ramps cross the threshold values, as illustrated in FIGS. 12F–12H for three different threshold values X, Y, and Z. It will be observed that the threshold values corresponding to the audio input voltage, are variable over a range corresponding to 180° of the original 1000 KHz signal. The comparator circuit 63 produces the corresponding trigger signal outputs at the levels P, D and Q, as shown in FIGS. 12K–12M. The outputs of the comparators 62 and 63 are applied, by way of differentiating capacitors, to spike generators and dc restorer circuits 66 and 67 respectively. The outputs of these spike generators are negative trigger pulses that are 180° apart with respect to the original 1000 KHz oscillations. These trigger signals are applied to the set and reset terminals of a flip-flop circuit 68, to produce square wave output voltages having phase conditions dependent upon the threshold levels of the comparator circuits. Thus, when the threshold level derived from the audio input corresponded to the levels X and P of the comparators 62 and 63 respectively, the output square wave has the relative phase position as illustrated in FIG. 12N. The variation of the phase position of the output of the flip-flop is shown for the threshold values Y and D in FIG. 12P, and for the threshold values Z and Q, as shown in FIG. 12Q. As a consequence, it is apparent that the output flip-flop signals, with variable phase positions as shown in FIGS. 12N–12Q, may be varied through a relative phase difference of 180° with respect to the original 1000 KHz oscillation.

Figure 12J:
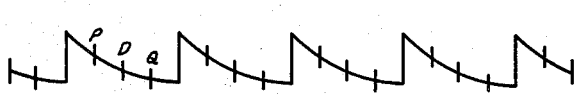
Figure 12K:
Figure 12L:
Figure 12M:
Figure 12N:
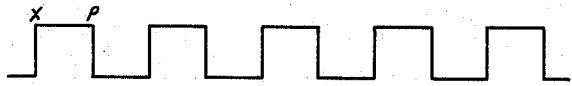
Figure 12P:
Figure 12Q:

The above technique is advantageous for developing the variable phase signal, since the useful portions of the ramp curves of FIGS. 12E and 12J vary approximately according to a square law. The shape of these voltages may, of course, be changed by changing the resistor-capacitor time constant in the respective differentiating circuits or by addition of shunt capacitances across the resistors in these differentiating networks.

Figure 12R:

From the above described system, it will be apparent that if the audio signal is employed to set the threshold value of the comparator, then the modulation signal will shift the phase of the output square wave from the exciter to the necessary 0° to 180° range. The fixed output for the reference phase square wave may be obtained from a number of different points in the system of FIG. 11. For example, as illustrated in FIG. 11, the output of the combining buffer 60 may be capacitively coupled to a reference phase 50% duty generator, in order to produce a square wave output signal synchronized with a given threshold level of the output ramp of the combining buffer 60. This reference phase generator 70 may be in the form of a comparator similar to the comparators 62 and 63, with a threshold level set by a potentiometer 71 to enable the attaining of a 50% duty cycle. The output of the generator 70 is squared in the squaring inverter 72, and then supplied by way of a conventional buffer 73 to the reference output terminal 74. This reference output is illustrated in FIG. 12R. The variable phase output from the flip-flop 68 may, of course, be applied to the variable phase output terminal 75 by way of a conventional buffer 76.

Referring still to FIG. 11, the clipper circuit 46 may comprise a squaring amplifier, the term "variable symmetry" referring to the fact that the operating point of transistors employed in this circuit is variable in such a way that the output wave form can have a large on time or a large off time, in order to vary the square symmetry of the output wave. This produces the result that, by varying the symmetry of the output of the clipper, the relative position of the two outputs of the divide by two counters can be controlled. The required position corresponds to a 90° phase relationship between the two counter outputs, in accordance with FIGS. 12B and 12D.

The diodes connected across the outputs of the differentiating networks 54–57 clip the negative overswings on the negative half cycles at each of the input waves. In one example of a circuit in accordance with the invention, the combining buffers 60 and 61 were comprised of emitter followers, connected in a manner similar to a differential amplifier, to produce the resultant output illustrated in FIGS. 12E and 12J.

The capacitors connected between the comparators 62 and 63 and the spike generators 66 and 67 effect the differentiating of the output of the comparators to provide relatively sharp positive going spikes. The spike generators may comprise transistor amplifiers, with diodes connected between the bases and ground to restore the dc level to the positive going halves of the spikes, and to clip off the negative halves. This results in the production of the spikes as illustrated in FIG. 11 at the output of the generators 66 and 67. The relative positions of the spikes from the spike generators 66 and 67, with proper setting of the circuit, thus, always correspond to 180° with respect to the original 1000 KHz oscillator wave form.

Figure 14:
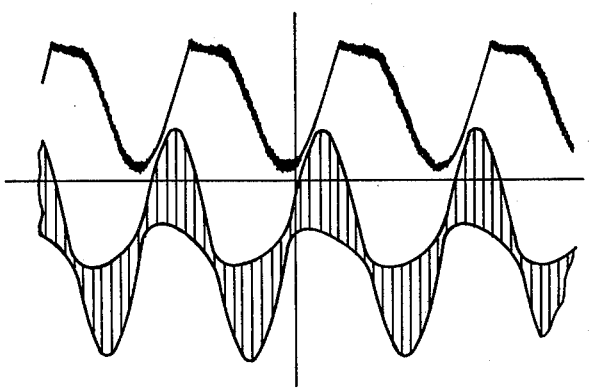
FIGS. 14 to 21 are oscillograms illustrating further wave forms in the exciter circuit shown in FIG. 11.
Figure 15:
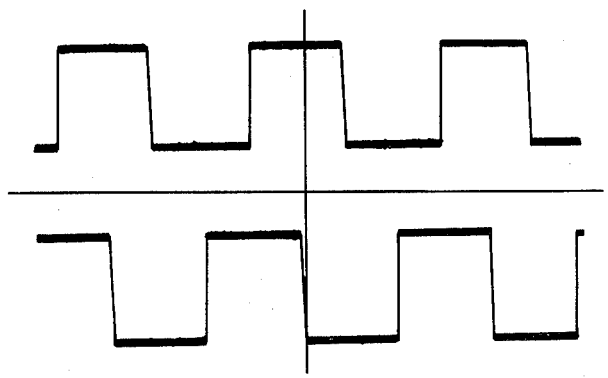
Figure 16:
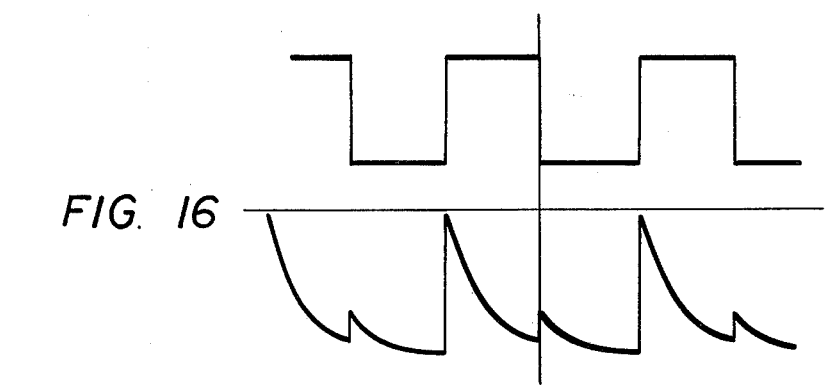

FIGS. 14 to 21 are oscillograms showing the wave forms produced in an actual embodiment of the exciter circuit of FIG. 11. Thus, the upper trace on FIG. 14 shows the output of crystal oscillator at 3 volts peak-to-peak at 1000 KHz. The lower trace is the output of the 50 watt transmitter at a dummy load, with about 90% modulation. FIG. 15 shows the two outputs from the divide by two counters 47 and 49 spaced 90° with respect to one another. The upper trace of FIG. 16 shows one of the counter outputs at 500 KHz and the lower trace shows the output of the following differentiating network.

Figure 17:
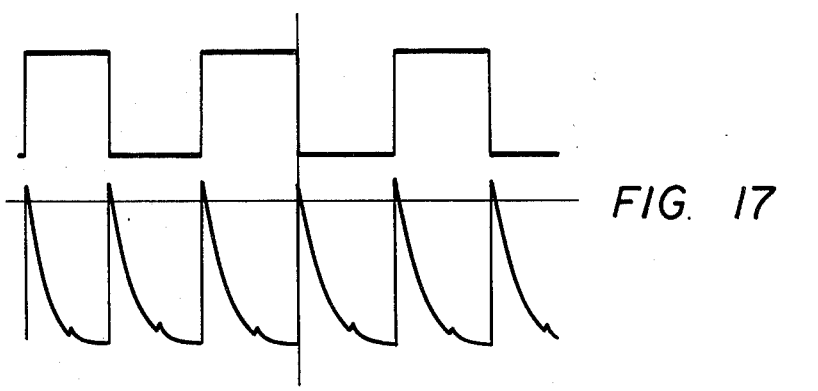
Figure 18:
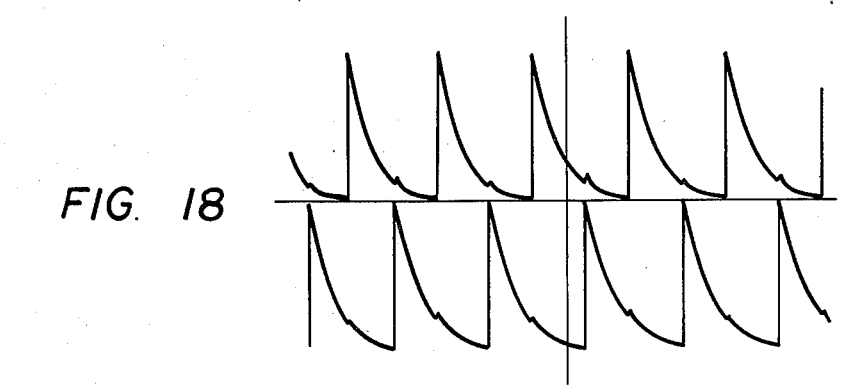

FIG. 17 shows the 500 KHz counter output compared to the output from the combining buffer illustrated in the bottom trace. FIG. 18 shows the outputs from the two combining buffers, illustrating the 90° relative spacing.

Figure 19:
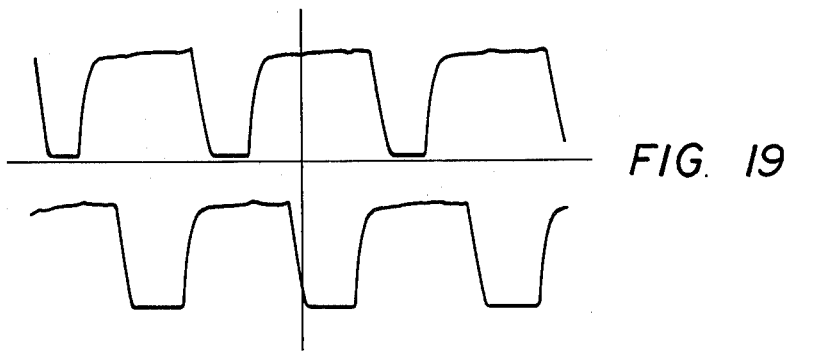
Figure 20:
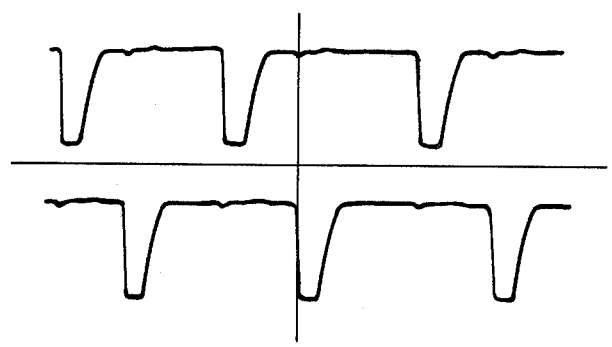

FIG. 19 shows the outputs from the comparators 62 and 63, and FIG. 20 shows the outputs of the two spike generators.

Figure 21:
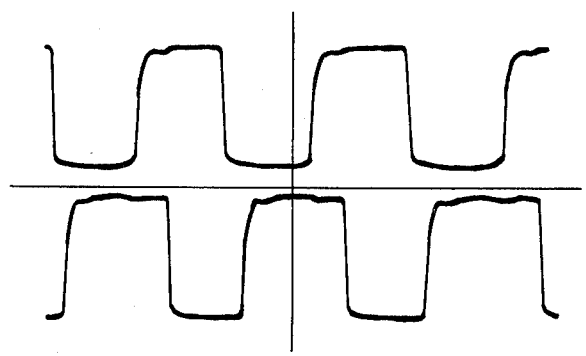

In FIG. 21, the upper trace is the reference output at terminal 74, set to approximately 50% duty factor, while the lower trace shows the variable phase output. While some of the curves do not have the ideal 50% duty cycle, this is a matter of adjustment of the circuits, and the results obtained with an exciter showing the traces as illustrated in these figures, were quite satisfactory.

Figure 13:
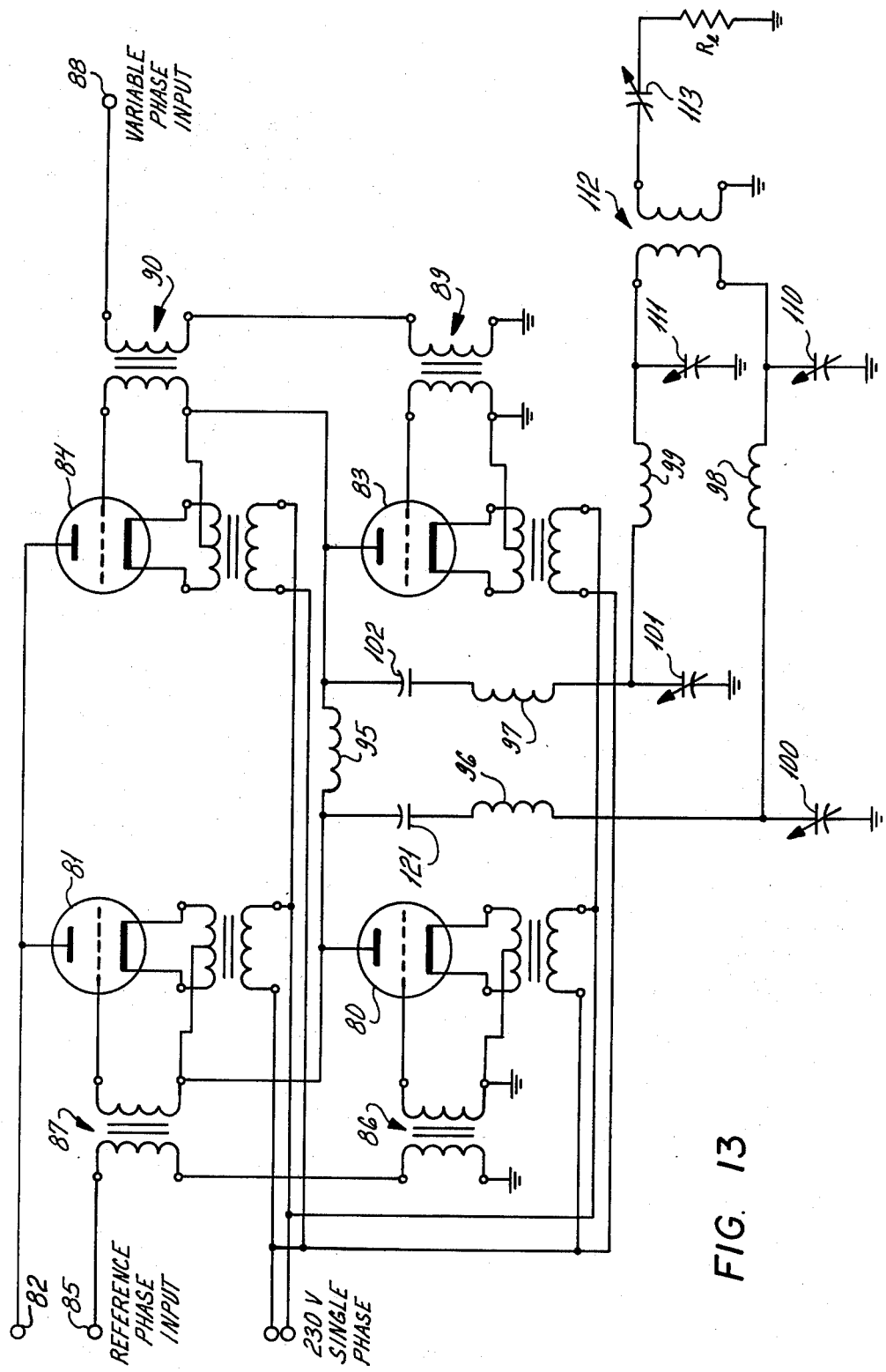
FIG. 13 is a simplified circuit diagram of a controlled energy oscillation generating circuit in accordance with a further embodiment of the invention.

FIG. 13 shows a circuit in accordance with the invention, wherein vacuum tubes have been employed for the switching and amplifying devices. In this arrangement, the vacuum tubes are preferably zero bias triodes, but, it will, of course, be apparent that the circuit may alternatively employ triodes which require bias on their control grids, or alternatively, with tetrodes having suitable voltages applied to their screen grids. The power output of the circuit, of course, depends upon the type of tube selected. The exciter system, as described with reference to FIG. 11, may be employed either in combination with the transistor circuit of FIG. 1, or the tube circuit of FIG. 13, for the production of an output of any desired power, it being, of course, required that the output buffer amplifiers of the exciter be designed to provide the necessary input drive voltage required by the selected tube or transistor.

In the circuit of FIG. 13, the cathode-anode circuits of the triodes 80 and 81 are serially connected between ground reference and the positive supply terminal 82, and similarly the cathode-anode current paths of the triodes 83 and 84 are serially connected between ground reference and the positive supply terminal 82. The reference phase input at terminal 85 is applied by way of coupling transformers 86 and 87 to the grids of the triodes 80 and 81 respectively, and similarly the variable phase square wave input at terminal 88 is applied by way of coupling transformers 89 and 90 to the control grids of the triodes 83 and 84 respectively.

Suitable separate filament transformers are provided for the tubes, as illustrated, the secondary windings of the filament transformers having center taps for the cathode-anode current of the tubes.

While the circuit of FIG. 13 may employ a common output transformer, as in the arrangement of FIG. 1, FIG. 13 illustrates a different output circuit which, of course, could alternately have been employed in the arrangement of FIG. 1. In place of the primary winding of the upper transformer as shown in FIG. 1, in FIG. 13 a radio frequency choke 95 is connected between the anodes of the triodes 80 and 83 for carrying the dc current. The load for the amplifier comprises a balanced T-network of input inductors 96 and 97, the output inductors 98 and 99, and shunt capacitors 100 and 101 respectively, with each of these T-networks being connected to a separate end of the inductor 95. For this latter connection, blocking capacitors 121 and 102 are provided, in order to isolate the dc voltage from the output network. Alternatively, if a coupling transformer had been used, it is apparent that the T-networks could have been connected to the separate secondary windings of the coupling transformer. Shunt capacitors 110 and 111 are connected at the outputs of the T-networks and an output transformer 112 has its primary winding connected between the outputs of the T-networks. A load, illustrated as a resistive load $R_1$ is coupled to the secondary winding of the transformer 112 by way of capacitor 113. The primary winding of the transformer 112 and the shunt capacitors 110 and 111 form a high Q tank circuit, which, by inductive coupling to the load $R_1$ through the output transformer 112 and series resonating capacitors, places a termination load at the output of the balanced T-network and this load is reflected to the proper value for loading the power amplifiers at the input of the T-networks.

It is, of course, apparent that the input transformers 86, 87, 89 and 90 are wide band high frequency transformers; these transformers delivering the drive signal to the control grids of the amplifier tubes.

While other input and output circuits may, of course, be employed, it is important that the load in the output circuit be as nearly purely resistive as possible. At odd harmonic frequencies, the load must be presented to the tubes as an inductive reactance.

As compared with previous arrangements, the present invention has a principle advantage of increased power conversion efficiency. Since the power amplifier output is a constant voltage square wave, the current flow at any modulation index occurs only during the flat minimum voltage across the active devices. As a consequence, the active devices are required to dissipate much less power, and can have lower power ratings. From this it, of course, follows that lower power is required for the cooling requirements of the active devices.

A further advantage of the system of the invention resides in the elimination of any type of modulator stage to impress modulation on the final amplifier. This not only increases the reliability of the system by the reduction of the number of parts in the transmitter, but also eliminates losses associated with such modulators, thereby providing a further substantial increase in overall efficiency.

Further, in the circuit, in accordance with the invention, there is no requirement for direct coupling or clamping or dc restoration after the ac coupling, to transmit dc information, since the system employs perfect square waves. In other words, the system of the invention employs symmetrical waves as opposed to rectangular waves which have shifting base line or axis asymmetry.

In the arrangement in accordance with the invention, there is in addition, no requirement for clamping of any back-swing voltage, since the upper and lower devices in the amplifier means, or "totem poles" are active on alternate half-cycles.

The output transformer or output circuit, as the case may be, receives a pulse every half cycle of the r-f carrier frequency, rather than one pulse per cycle as in conventional single ended output circuits. This renders the filtering of the output much easier since the output wave form contains no even harmonics.

While the invention has been disclosed and described with reference to a limited number of embodiments, it will be apparent that variations and modifications may be made therein, and it is therefore intended in the following claims to cover each such variation and modification as falls within the true spirit and scope of the invention.

What is claimed is:

1. System for producing variable phase square wave signals comprising;
    means producing an oscillator output signal;
    phase shift means connected to receive said output signal for producing an output signal shifted in phase by a preselected amount relative to said oscillator output signal;
    first and second ramp signal producing means connected to receive said oscillator output signal and the phase shifted signal, respectively, said first and said second ramp signal producing means each producing a ramp waveform signal on every half cycle of the respective input signal;

first and second comparator means, each having one input connected, respectively, to the outputs of said first and second ramp signal producing means;

means for feeding a variable level signal to the threshold inputs of said first and said second comparators; and a bistable circuit means having set and reset inputs connected to the outputs from said first and second comparator means, whereby the phase of the output signal of said bistable circuit means is a function of the variable level signal.

2. The system of claim 1, wherein said oscillator means comprises a crystal-controlled sine wave oscillator producing an output signal fed to a symmetrical clipper circuit for producing a square wave oscillator output signal.

3. The system of claim 1, wherein said phase shift means comprises an inverter connected to receive said oscillator output signal and further comprising first and second frequency divider units, said first frequency divider connected to receive said oscillator output signal and said second frequency divider being connected to receive said inverter output signal for producing two output signals separated in phase by a preselected amount and representing a frequency divided oscillator output signal fed to said first ramp signal producing means and representing a frequency divided inverter output signal being fed to said second ramp signal producing means.

4. The system of claim 1, wherein said first and second ramp signal producing means include, respectively, first buffer means and first inverter means connected to receive said oscillator output signal, and second buffer means and second inverter means connected to receive said phase-shifted output signal, the outputs from said first buffer means and first inverter means and second buffer means and second inverter means being combined, respectively, to form the two ramp waveform signals.

5. The system of claim 4, wherein said first and second ramp signal producing means further include first and second differentiating means connected, respectively, to said first buffer means and first inverter means, for producing differentiated output signals fed, respectively, to first and second current level restoring means, each producing output signals having substantially only direct current components, and third and fourth differentiating means, connected, respectively, to said second buffer means and said second inverter means for producing a differentiated output signal fed respectively to third and fourth direct current level restoring means, each producing output signals having only substantially direct current components.

6. The system of claim 5, further comprising first combining buffer means connected to said output signals from said first and second level restoring means for producing an additively combined output signal fed to said first comparator means, and second combining buffer means connected to receive said output signals from said third and fourth direct current restoring means, for producing an additively combined output signal fed to said second comparator means.

7. The system of claim 1, further comprising first and second differentiating means, connected, respectively, to the outputs of said first and second comparator means and being mutually connected in series, respectively, to first and second spike generator means, each producing output signals fed to said bistable circuit means.

8. The system of claim 1, further comprising reference signal generating means connected to receive said first ramp signal for producing therefrom a reference signal relative to said output signal from said bistable circuit means.

9. The system of claim 8, wherein said reference signal means comprises a 50% duty cycle square wave generator connected to be triggered by said first ramp signal for producing a square wave reference signal.

10. Apparatus for producing two output signals whose relative phase is a function of a variable level audio input signal, said apparatus comprising:

means for producing a clock signal;

phase shift means connected to said clock signal for producing a phase shift signal shifted from said clock signal by a preselected angle;

ramp signal means connected to receive said clock signal and said phase shift signal for producing first and second unipolar ramp signals having a relative phase difference equal to said preselected angle;

first and second variable threshold comparator means having said first and second unipolar ramp signals applied thereto and said variable level audio input signal applied to the variable threshold inputs of each comparator, said first and second variable threshold comparator means producing respective trigger outputs signals having descending flanks at the start of the corresponding ramps and ascending flanks when the ramps cross the thresholds determined by said audio input signal;

reference signal generator means connected to one of said first and second ramp signals for producing one of the two output signals; and bistable multivibrator means connected to said first and second trigger signals for producing the other of the two output signals.

11. the apparatus of claim 10, wherein said ramp signal means comprise first buffer means and first inverter means connected to receive said clock signal and second buffer means and second inverter means connected to receive said phase shifted signal, the output from said first buffer means and first inverter means being combined to form a ramp signal having a ramp on every half cycle, the outputs from said second buffer means and said second inverter means being combined to form a ramp signal having a ramp on every half cycle.

12. The apparatus of claim 11, further comprising first and second differentiating means connected, respectively, to said first buffer means and said first inverter means for producing differentiated output signals fed respectively to first and second direct current level restoring means, each producing output signals having only direct current components, and third and fourth differentiating means connected, respectively, to said second buffer means and said second inverter means for producing differentiated output signals fed, respectively, to said third and fourth direct current level restoring means, for producing output signals having only direct current components.

13. The apparatus of claim 12, further comprising first combining buffer means connected to receive said output signals from said first and second direct current level restoring means for producing an additively combined output signal fed to said first comparator means, and second combining buffer means connected to receive said output signals from said third and fourth direct current level restoring means for producing an additively combined output signal fed to said second comparator means.

14. The apparatus of claim 10, further comprising first and second differentiating means connected to the outputs of said first and second comparator means, respectively, and being mutually connected in series with first and second spike generator means, each for producing said trigger signals fed to said bistable multivibrator means.

15. The system of claim 10, wherein said reference signal generator comprises a 50% duty cycle square-wave generator connected to be triggered by said first ramp signal for producing a square wave reference signal.

* * * * *